United States Patent
Park et al.

(10) Patent No.: US 7,567,103 B2
(45) Date of Patent: Jul. 28, 2009

(54) APPARATUS FOR DETECTING AND PREVENTING A LOCK FAILURE IN A DELAY-LOCKED LOOP

(75) Inventors: In-soo Park, Suwon-si (KR); Young-soo Sohn, Gunpo-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/007,321

(22) Filed: Jan. 9, 2008

(65) Prior Publication Data
US 2008/0169853 A1 Jul. 17, 2008

(30) Foreign Application Priority Data
Jan. 11, 2007 (KR) ...................... 10-2007-0003394

(51) Int. Cl.
H03L 7/06 (2006.01)
(52) U.S. Cl. ...................................... 327/158; 327/149
(58) Field of Classification Search ................. 327/147, 327/149, 156, 158, 161
See application file for complete search history.

(56) References Cited

U.S. PATENT DOCUMENTS

| | | | |
|---|---|---|---|
| 6,963,234 B2 * | 11/2005 | Bidenbach | 327/158 |
| 7,042,971 B1 * | 5/2006 | Flanagan et al. | 375/376 |
| 7,116,149 B2 | 10/2006 | Kim | |
| 7,142,026 B2 * | 11/2006 | Kwak | 327/158 |
| 7,180,346 B2 | 2/2007 | Lee | |
| 7,183,824 B2 | 2/2007 | Park et al. | |
| 7,365,583 B2 * | 4/2008 | Shin | 327/158 |
| 7,414,446 B2 * | 8/2008 | Kim | 327/158 |
| 7,423,492 B2 * | 9/2008 | Seefeldt | 331/25 |
| 7,449,930 B2 * | 11/2008 | Hur | 327/158 |
| 7,479,816 B2 * | 1/2009 | Lee et al. | 327/158 |
| 2006/0132205 A1 * | 6/2006 | Wu et al. | 327/158 |
| 2006/0290397 A1 * | 12/2006 | Kim | 327/158 |
| 2007/0069775 A1 * | 3/2007 | Ku et al. | 327/158 |
| 2007/0069776 A1 * | 3/2007 | Hur | 327/158 |
| 2007/0085580 A1 * | 4/2007 | Singh et al. | 327/158 |
| 2007/0262798 A1 * | 11/2007 | Yun et al. | 327/158 |
| 2008/0054964 A1 * | 3/2008 | Lee et al. | 327/158 |
| 2008/0164920 A1 * | 7/2008 | Cho | 327/158 |
| 2008/0164921 A1 * | 7/2008 | Shin | 327/158 |
| 2008/0169853 A1 * | 7/2008 | Park et al. | 327/158 |
| 2008/0315926 A1 * | 12/2008 | Yoo | 327/157 |

FOREIGN PATENT DOCUMENTS

| | | |
|---|---|---|
| KR | 10-2004-0100267 | 12/2004 |
| KR | 10-2005-0064241 | 6/2005 |
| KR | 10-2006-0037564 | 5/2006 |

* cited by examiner

*Primary Examiner*—Lincoln Donovan
*Assistant Examiner*—Adam D Houston
(74) *Attorney, Agent, or Firm*—Lee & Morse, P.C.

(57) ABSTRACT

An apparatus for detecting a lock failure and correcting a duty cycle includes a lock failure detector configured to determine whether a first internal clock signal is locked to a second internal clock signal and to output a lock failure signal in response thereto, a duty cycle correction unit configured to correct a duty cycle of an external clock signal responsive to the lock failure signal and to output the duty-cycle-corrected external clock signal as the first internal clock signal, and a delay unit configured to generate the second internal clock signal by delaying the first internal clock signal.

20 Claims, 3 Drawing Sheets

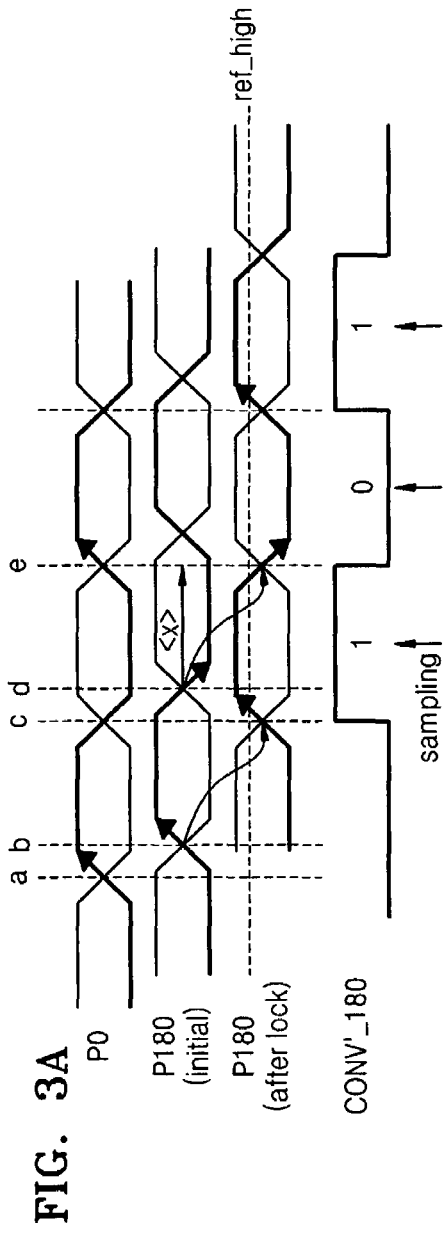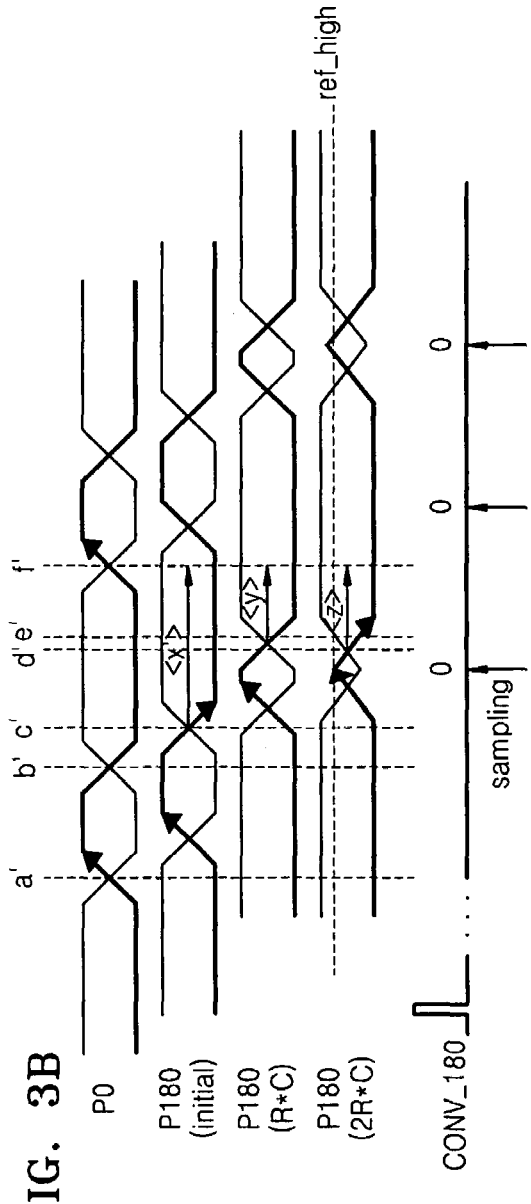

APPARATUS FOR DETECTING AND PREVENTING A LOCK FAILURE IN A DELAY-LOCKED LOOP

BACKGROUND OF THE INVENTION

1. Field of the Invention

Embodiments relate to an apparatus for detecting and preventing a lock failure in a delay locked loop (DLL). More particularly, embodiments relate to an apparatus that detects a lock failure caused by a distortion of a duty cycle in a DLL and prevents the lock failure by correcting the duty cycle.

2. Description of the Related Art

In general, a DLL controls the phase of an internal clock signal of a semiconductor memory device, to lock the internal clock signal to correspond to an external clock signal. In operation, a DLL delays an internal clock signal using a delay line, such that rising edges or falling edges of the internal clock signal correspond to rising edges or falling edges of an external clock signal.

One particular type of DLL is a self bias DLL. A conventional self bias DLL includes a phase detector, a charge pump, a duty cycle correction circuit, and a delay line. The phase detector compares the phase of a signal output from the duty cycle correction circuit, i.e., an internal clock signal, to the phase of a delayed internal clock signal and detects a phase difference between the internal clock signal and the delayed internal clock signal on the basis of the internal clock signal. The phase detector outputs information about the detected phase difference to the charge pump.

The charge pump generates a control signal for controlling a delay time of delay cells of the delay line in response to the information about the phase difference output from the phase detector. In addition, the charge pump generates a bias signal that makes transistors included in the DLL operate in a saturation mode. The control signal and the bias signal are transmitted to the duty cycle correction circuit and the respective delay cells of the delay line.

The duty cycle correction circuit removes duty cycle errors existing in one or more external clock signals input thereto to correct the duty cycle of the external clock signals and outputs signals having a normal duty cycle (signals having a duty ratio of 50%:50%) as internal clock signals. The delay line includes the plurality of delay cells. The delay line delays the internal clock signals by the phase difference detected by the phase detector in response to the control signal and outputs delayed internal clock signals.

The plurality of delay cells each has a variable delay. The delay of each delay cell is controlled by the control signal applied to the charge pump. The delay cell increases the delay while increasing its RC time constant in response to the control voltage. Typically, the RC time constant of the delay cell is initialized to a given value. When the detected phase difference has a value X, and thus a delay corresponding to X is required, each delay cell delays the input signal thereof by a given portion of the delay. That is, when the delay line includes four delay cells, each delay cell delays the input signal thereof by X/4. The self bias DLL includes a minimum number of delay cells in order to minimize the consumption power and circuit area thereof, and thus it generally includes four delay cells.

In order to increase the delay of the delay cells, the RC time constant of the delay cells must be increased. That is, when the initial RC time constant is RC, it is increased to 2RC in order to increase the delay of the delay cells. However, when the RC time constant is increased, a capacitor charge-up time is also increased. Since capacitor charge-up must be carried out within a given time, sufficient charge up is not achieved in a delay cell having a large RC time constant. Consequently, an internal clock signal cannot be locked to the external clock signal, resulting in a lock failure.

Therefore, in the conventional self bias DLL, when the delay increases because the duty cycle of the clock signal is distorted, a sufficient charge-up time according to an increase in the RC time constant may result in a lock failure. Accordingly, there remains a need for an apparatus for detecting and preventing a lock failure in a DLL that addresses one or more of these concerns.

SUMMARY OF THE INVENTION

Embodiments are therefore directed to an apparatus that detects a lock failure caused by a distortion of duty cycle and prevents the lock failure by correcting the duty cycle.

It is therefore a feature of an embodiment of the present invention to provide a DLL that detects a lock failure caused by a distortion of duty cycle and prevents the lock failure by correcting the duty cycle.

At least one of the above and other features of the present invention may be realized by providing an apparatus for detecting a lock failure and correcting a duty cycle, the apparatus including a lock failure detector to determine whether a first internal clock signal is locked to a second internal clock signal and to output a lock failure signal in response thereto, a duty cycle correction unit to correct a duty cycle of an external clock signal in response to the lock failure signal and to output the duty-cycle-corrected external clock signal as the first internal clock signal, and a delay unit to generate the second internal clock signal by delaying the first internal clock signal.

The lock failure detector may include a coding unit to convert one of the first internal clock signal or the second internal clock signal into a code signal, and a decoder to produce the lock failure signal by decoding the code signal, the lock failure signal having a logic level that in accordance with a result of the decoding. The coding unit may include a first CMOS converter to convert one of the first internal clock signal or the second internal clock signal into a CMOS level signal and to output the CMOS level signal as a digital signal, and a sampler to produce the code signal by sampling the digital signal. The coding unit may further include a second CMOS converter to receive the other one of the first internal clock signal or the second internal clock signal, to convert the received signal into a CMOS level signal, and to output the CMOS level signal as the digital signal.

The duty cycle correction unit may include a charge pump to receive the first internal clock signal and to generate a duty control signal responsive to the first internal clock signal, and an amplifier to correct the duty cycle of the external clock signal and to output the duty-cycle-corrected external clock signal as the first internal clock signal responsive to the duty control signal and the lock failure signal.

The amplifier may include a first differential amplifying circuit to differentially amplify the internal clock signal and an inverted internal clock signal, and a second differential amplifying circuit, connected in parallel with the first differential amplifying circuit, to differentially amplify the duty control signal and an inverted duty control signal in response to the lock failure signal.

The first differential amplifying circuit may include a first MOS transistor having a first terminal connected to a source of a high voltage through a first resistor and a gate receiving the non-inverted external clock signal, a second MOS transistor having a first terminal connected to the source of the high voltage through a second resistor and a gate receiving the inverted external clock signal, and a first bias transistor having a first terminal connected to a second terminal of the first MOS transistor and a second terminal of the second MOS transistor, a second terminal connected to a source of a low voltage, and a gate receiving a bias signal.

The second differential amplifying circuit may include a third MOS transistor having a first terminal connected to the first terminal of the first MOS transistor and a gate receiving the inverted duty control signal, a fourth MOS transistor having a first terminal connected to the first terminal of the second MOS transistor and a gate t receiving the duty control signal, a fifth MOS transistor having a first terminal connected to the first terminal of the first MOS transistor and a gate receiving the inverted duty control signal, a sixth MOS transistor having a first terminal connected to a second terminal of the fifth MOS transistor and a gate receiving the lock failure signal, a seventh MOS transistor having a first terminal connected to the first terminal of the second MOS transistor and a gate receiving the duty control signal, an eighth MOS transistor having a first terminal connected to a second terminal of the seventh MOS transistor and a gate connected to the source of the low voltage, and a second bias transistor having a first terminal connected to a second terminal of the sixth MOS transistor, a second terminal of the third MOS transistor, a first terminal of the fourth MOS transistor and a second terminal of the eighth MOS transistor, and a gate receiving the bias signal, wherein the first through eighth MOS transistors operate in a saturation mode responsive to the bias signal. Further, the lock failure signal may be enabled to logic high level and applied to the gate of the sixth MOS transistor, the duty cycle may be corrected to increase a logic high period of the internal clock signal.

At least one other of the above and other features of the present invention may be realized by providing a delay locked loop including a lock failure detector to determine whether a first internal clock signal is locked to a second internal clock signal and to output a lock failure signal in response thereto, a duty cycle correction unit to correct a duty cycle of an external clock signal in response to the lock failure signal and to output the duty-cycle-corrected external clock signal as the first internal clock signal, a phase detector to detect a phase difference between the first and second internal clock signals and to output a phase difference signal, a first charge pump to determine a control signal for the delay line in accordance with the phase difference signal and to output the control signal, and a delay line, including n delay cells connected in series, to generate the second internal clock signal by delaying the first internal clock signal according to the control signal.

The lock failure detector may include a coding unit to convert the first internal clock signal into a code signal, and a decoder to produce the lock failure signal by decoding the code signal, the lock failure signal having a logic level that is based at least in part on a result of the decoding. The coding unit may include a CMOS converter to convert one of the first and second internal clock signals into a CMOS level signal and to output the CMOS level signal as a digital signal, and a sampler to produce the code signal by sampling the digital signal. The coding unit may further include a second CMOS converter to receive the other one of the first and second internal clock signals, to detect a lock point of the received signal, to convert the received signal into a CMOS level signal, and to output the CMOS level signal as the digital signal.

The duty cycle correction unit may include a second charge pump to receive the first internal clock signal and to generate a duty control signal responsive to the first internal clock signal, and an amplifier to correct the duty cycle of the external clock signal and to output the duty-cycle-corrected external clock signal as the first internal clock signal responsive to the duty control signal and the lock failure signal.

The amplifier may include a first differential amplifying circuit to differentially amplify the internal clock signal and an inverted internal clock signal, and a second differential amplifying circuit, connected in parallel with the first differential amplifying circuit, to differentially amplify the duty control signal and an inverted duty control signal in response to the lock failure signal.

The first differential amplifying circuit may include a first MOS transistor having a first terminal connected to a source of a high voltage through a first resistor and a gate to receive the non-inverted external clock signal, a second MOS transistor having a first terminal connected to the source of the high voltage through a second resistor and a gate to receive the inverted external clock signal, and a first bias transistor having a first terminal connected to a second terminal of the first MOS transistor and a second terminal of the second MOS transistor, a second terminal connected to a source of a low voltage, and a gate to receive a bias signal.

The second differential amplifying circuit may include a third MOS transistor having a first terminal connected to the first terminal of the first MOS transistor and a gate receiving the inverted duty control signal, a fourth MOS transistor having a first terminal connected to the first terminal of the second MOS transistor and a gate t receiving the duty control signal, a fifth MOS transistor having a first terminal connected to the first terminal of the first MOS transistor and a gate receiving the inverted duty control signal, a sixth MOS transistor having a first terminal connected to a second terminal of the fifth MOS transistor and a gate receiving the lock failure signal, a seventh MOS transistor having a first terminal connected to the first terminal of the second MOS transistor and a gate receiving the duty control signal, an eighth MOS transistor having a first terminal connected to a second terminal of the seventh MOS transistor and a gate connected to the source of the low voltage, and a second bias transistor having a first terminal connected to a second terminal of the sixth MOS transistor, a second terminal of the third MOS transistor, a first terminal of the fourth MOS transistor and a second terminal of the eighth MOS transistor, and a gate receiving the bias signal, wherein the first through eighth MOS transistors operate in a saturation mode responsive to the bias signal.

The lock failure signal may be enabled to logic high level and applied to the gate of the sixth MOS transistor, the duty cycle may be corrected to increase a logic high period of the internal clock signal. Further, the n delay cells may all be turned on to delay the first internal clock signal and the n delay cells all have the same delay. When the lock failure signal is enabled to logic high level and applied to the gate of the sixth MOS transistor, the duty cycle is corrected to increase a logic high period of the first internal clock signal.

BRIEF DESCRIPTION OF THE DRAWINGS

The above and other features and advantages of the present invention will become more apparent to those of ordinary skill in the art by describing in detail exemplary embodiments thereof with reference to the attached drawings, in which:

FIG. 3A illustrates a waveform diagram of an apparatus for detecting and preventing a lock failure according to an embodiment of the present invention; and FIG. 3B illustrates a waveform diagram of an apparatus for detecting and preventing a lock failure according to another embodiment of the present invention.

DETAILED DESCRIPTION OF THE INVENTION

Figure 1:
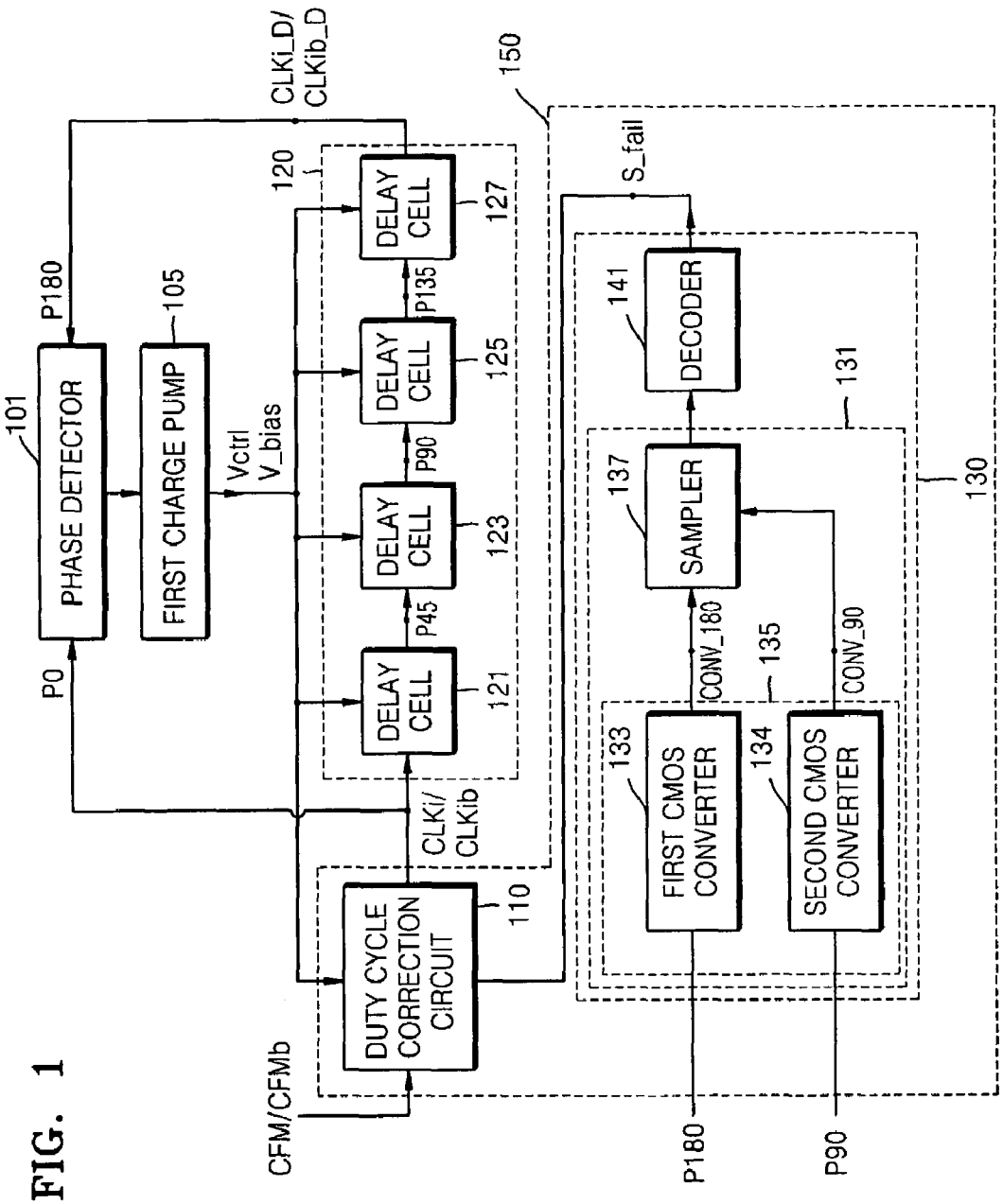
FIG. 1 illustrates a block diagram of a DLL according to an embodiment of the present invention.

Korean Patent Application No. 10-2007-0003394, filed on Jan. 11, 2007, in the Korean Intellectual Property Office, and entitled: "Apparatus for Preventing Lock Failure and Delay Locked Loop Having the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as being limited to the embodiments set forth herein. Rather, these embodiments are provided so that this disclosure will be thorough and complete, and will fully convey the scope of the invention to those skilled in the art.

In the figures, dimensions may be exaggerated for clarity of illustration. Furthermore, like reference numerals refer to like elements throughout.

An exemplary embodiment of the present invention will be described with reference to the block diagram of a DLL as illustrated in FIG. 1. The DLL illustrated in FIG. 1 includes a lock failure preventing apparatus 150, a phase detector 101, a first charge pump 105, and a delay line 120. The lock failure preventing apparatus 150 may include a duty cycle correction circuit 110 and a lock failure detector 130. The delay line 120 may include four delay cells 121, 123, 125 and 127, although the scope of the present invention is not so limited.

In operation, the phase detector 101 compares a phase of a signal P0 generated by passing an external clock signal CFM and an inverted external clock signal CFMb through a duty cycle correction circuit 110 to a phase of a delayed internal clock signal P180 to detect any phase difference between the signal P0 and the delayed internal clock signal P180. The phase detector 101 outputs information about any detected phase difference to the first charge pump 105.

In response to the output signal of the phase detector 101, the first charge pump 105 outputs control signal Vctrl and bias signal V_bias to control a delay and to operate transistors of the DLL in a saturation mode, respectively. Control signal Vctrl and bias signal V_bias are provided to both the duty cycle correction circuit 110 and the delay line 120. The duty cycle correction circuit 110 may be employed to remove duty cycle errors existing in external clock signals CFM and CFMb, and to correct the duty cycles thereof. Correcting the duty cycle of external clock signals CFM and CFMb may result in an output signal including duty-cycle-corrected internal clock signals CLKi and CLKib that have a normal duty cycle, i.e., signals that may have a duty cycle of 50%: 50%, for example. In this embodiment, the internal clock signal CLKi may serve as the signal P0.

The delay line 120 may delay the internal clock signal CLKi and the inverted internal clock signal CLKib by a given delay in response to the control signal Vctrl. The given delay may correspond to the phase difference detected by the phase detector 101. For example, the delay line 120 may delay the internal clock signal CLKi and the inverted clock signal CLKib by the phase difference detected by the phase detector 101, and may output delayed internal clock signals CLKi_D and CLKib_D, such that rising edges of the signal P0 correspond to falling edges of the delayed internal clock signal P180. This aspect of the invention will be described in greater detail later with reference to FIG. 3A. Briefly, however, when a single period of a signal has a phase of 360°, a maximum delay in the self-bias DLL may be a half period (i.e., 180°). Accordingly, delay cells 121, 123, 125 and 127 may be configured such that together they may delay a half period of a signal.

When the delay line 120 includes n delay cells, each delay cell may delay a phase corresponding to the maximum delay divided by n, e.g., 180°/n. In the present embodiment, where the delay line 120 includes four delay cells, each delay cell delays a phase by 45°. Accordingly, signals respectively output from the delay cells 121, 123, 125 and 127 are denoted as P45, P90, P135 and P180. Although fewer or greater than four delay cells may be employed in other embodiments, in this embodiment a minimum number of four delay cells may be employed in order to minimize power consumption and/or circuit area.

The external clock signal CFM and the inverted external clock signal CFMb may be duty-cycle-corrected by the duty cycle correction circuit 110, and may be respectively output as duty-cycle-corrected internal clock signal CLKi and duty-cycle-corrected inverted internal clock signal CLKib. The internal clock signal CLKi and the inverted internal clock signal CLKib may be delayed by the delay cells 121, 123, 125 and 127, and may be respectively output as a delayed internal clock signal CLKi_D and an inverted delayed internal clock signal CLKib_D, with the delayed internal clock signal CLKi_D corresponding to signal P180.

The lock failure detector 130 may receive the delayed internal clock signal P180 and internal clock signal P0, and may sample the delayed internal clock signal P180 to detect and determine a lock failure. The lock failure detector 130 may output a lock failure signal S_fail to the duty cycle correction circuit 110.

The lock failure detector 130 may include a lock failure coder 131 and a decoder 141. The lock failure coder 131 may include a CMOS converter portion 135 and a sampler 137. The CMOS converter portion 135 may include a first CMOS converter 133 and a second CMOS converter 134. The first CMOS converter 133 may convert the delayed internal clock signal P180 from the delay line 120 into a CMOS level signal, and may output it as a digital signal CONV_180. The second CMOS converter 134 may receive one of the internal clock signal CLKi (i.e., internal clock signal P0), output signal P45 of delay cell 121, output signal P90 of delay cell 123 and output signal P135 of delay cell 125, and may convert the received signal into a CMOS level signal CONV_XX, where XX is 45 if signal P45 is received, 90 if signal P90 is received, etc. In FIG. 1, it is assumed that signal P90 is received by the second CMOS converter 134. Hence, in FIG. 1, the output of the second CMOS converter 134 is illustrated as signal CONV_90. Here, the second CMOS converter 134 may receive a signal having no lock failure, that is, a signal having rising edges and falling edges, wherein the falling edges are distinguishable from the rising edges. The output of the second CMOS converter 134, namely signal CONV_90, may be used as a reference signal by the sampler 137.

The sampler 137 may sample the digital signal CONV_180 output from the first CMOS converter 133 according to the signal CONV_90 output from second CMOS converter 134. In this embodiment, the sampler 137 detects a logic level of the digital signal CONV_180 at a given rate, outputs a sample signal at a logic high level when the detected level of the digital signal CONV_180 is higher than a reference level, i.e., higher than the value of signal CONV_90, and outputs the sample signal at a logic low level when the detected level of the digital signal CONV_180 is lower than the reference level, i.e., is lower than the value of signal CONV_90. The output of the sampler 137 may be described as a code signal that the decoder 141 may then decode. Particular operations of sampler 137 will be explained in more detail with reference to FIGS. 3A and 3B, later.

The decoder 141 may receive a signal output from the sampler 137, may determine whether a lock failure occurs in the delayed internal clock signal P180 and accordingly, may output a lock failure signal S_fail. The lock failure signal S_fail includes information about whether the delayed internal clock signal P180 is locked to the internal clock signal P90. The decoder 141 may raise the lock failure signal S_fail to a logic high level when the lock failure occurs and may lower the lock failure signal S_fail to a logic low level when the lock failure does not occur.

In this embodiment, duty cycle correction circuit 110 may correct the duty cycle of the external clock signal CFM and the inverted external clock signal CFMb in response to the lock failure signal S_fail, and may respectively output the external clock signal CFM and the inverted external clock signal CFMb as the internal clock signal CLKi and the inverted internal clock signal CLKib. Particular structure and operation of the duty cycle correction circuit 110 will be explained in greater detail with reference to FIGS. 2A and 2B.

Figure 2A:
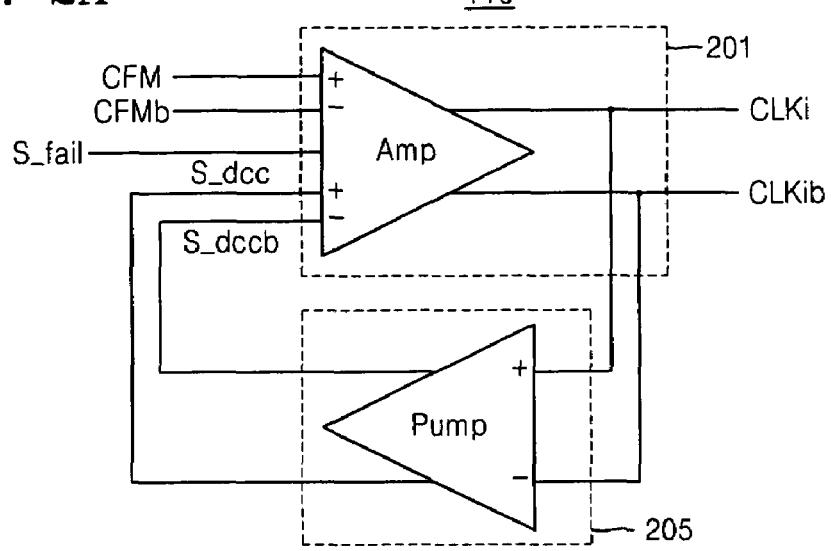
FIG. 2A illustrates a circuit diagram of a duty cycle correction circuit of a DLL illustrated in FIG. 1.

FIG. 2A illustrates a circuit diagram of the duty cycle correction circuit 110 illustrated in FIG. 1, in accordance with an embodiment. In FIG. 2A, the duty cycle correction circuit 110 is illustrated as including an amplifier 201 and a second charge pump 205. In a feedback arrangement, the charge pump 205 may provide a duty control signal S_dcc and an inverted duty control signal S_dccb to the amplifier 201, and may control the voltage magnitudes of these signals in response to receiving the duty-cycle-corrected internal clock signals CLKi and CLKib.

The amplifier 201 may control the duty cycle of the external clock signal CFM and the inverted external clock signal CFMb in response to the duty control signal S_dcc and the inverted duty control signal S_dccb. The amplifier 201 may receive the lock failure signal S_fail, and may further control the duty cycle of the external clock signal CFM and the inverted external clock signal CFMb in response to the lock failure signal S_fail. Accordingly, the amplifier 201 may rapidly correct the duty cycle in response to a duty cycle distortion, e.g., caused by an increase in an RC time constant due to an increase in the delay.

Figure 2B:
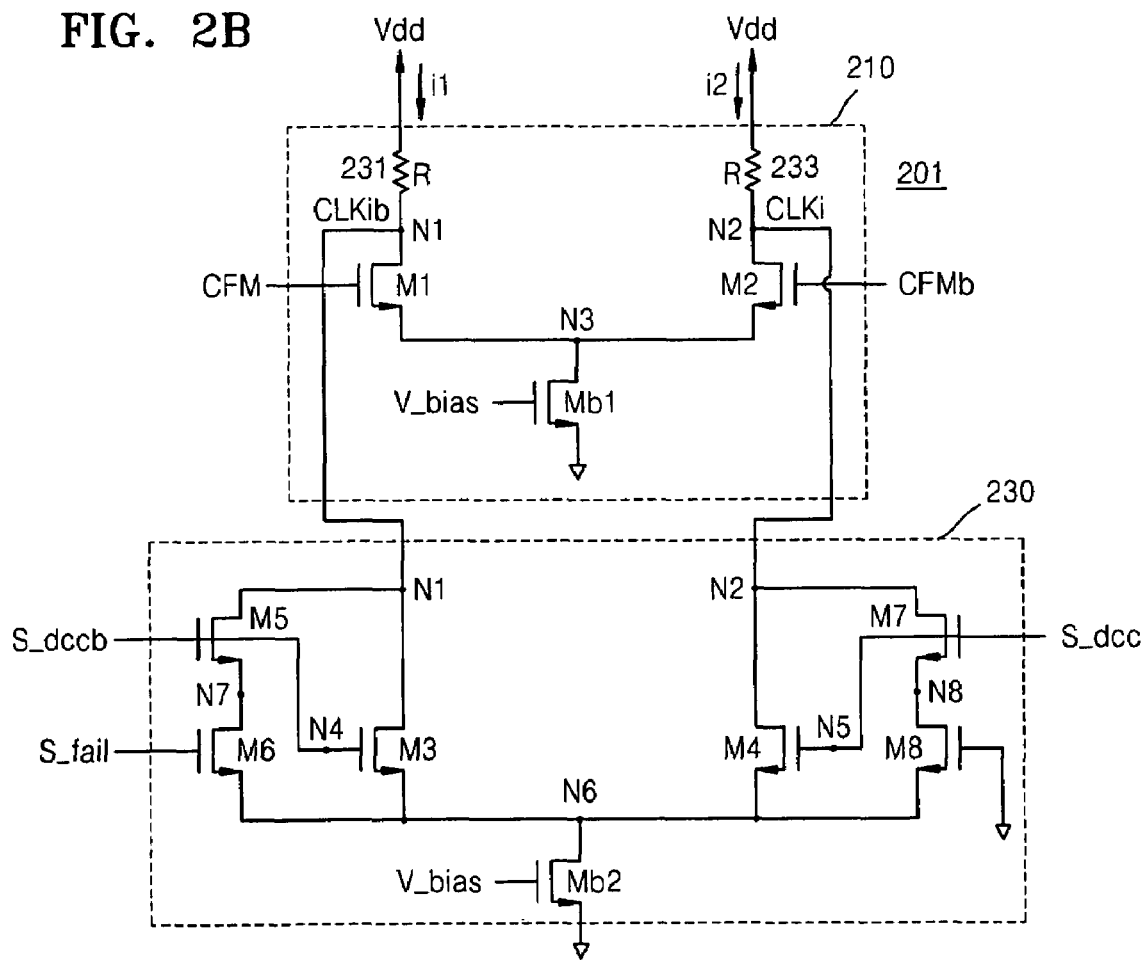
FIG. 2B illustrates a circuit diagram of an amplifier of a DLL as illustrated in FIG. 2A.

FIG. 2B illustrates a circuit diagram of the amplifier 201 in FIG. 2A, according to an embodiment. In this embodiment, the amplifier 201 of FIG. 2A may be a differential amplifier having a plurality of MOS transistors M1-M8, although the scope of the present invention is not so limited. The MOS transistors may be arranged to provide devices that include a first differential amplifying circuit 210 and a second differential amplifying circuit 230.

In particular, the first differential amplifying circuit 210 may include the first and second MOS transistors M1 and M2. The first MOS transistor M1 may have a first terminal coupled to a source of a high voltage Vdd through a first resistor R 231 and a gate receiving the external clock signal CFM. The second MOS transistor M2 may have a first terminal connected to the source of the high voltage Vdd through a second resistor R 233 and a gate receiving the inverted external clock signal CFMb. A first bias transistor Mb1 may have a first terminal connected to a second terminal of the first MOS transistor M1 and a second terminal of the second MOS transistor, via a third node N3, a second terminal connected to a source of a low voltage, e.g., ground, and a gate receiving the bias signal V_bias from the first charge pump 105.

The second differential amplifying circuit 230 may include third to eighth transistors M3-M8. The third MOS transistor M3 may have a first terminal connected to the first terminal of the first MOS transistor M1, via a first node N1, and a gate receiving the inverted duty control signal S_dccb. A fourth MOS transistor M4 may have a first terminal connected to the first terminal of the second MOS transistor M2, via a second node N2, and a gate receiving the duty control signal S_dcc. A fifth MOS transistor M5 may have a first terminal connected to the first terminal of the first MOS transistor M1, via the first node N1, and a gate receiving the inverted duty control signal S_dccb. A sixth MOS transistor M6 may have a first terminal connected to a second terminal of the fifth MOS transistor M5, via a seventh node N7, and a gate receiving the lock failure signal S_fail. A seventh MOS transistor M7 may have a first terminal connected to the first terminal of the second MOS transistor M2, via the second node N2, and a gate receiving the duty control signal S-dcc. An eighth MOS transistor M8 may have a first terminal connected to a second terminal of the seventh MOS transistor M7, via an eighth node N8, and a gate connected to the source of the low voltage, e.g., ground. A second bias transistor Mb2 may have a first terminal connected to a second terminal of the sixth MOS transistor, a second terminal of the third MOS transistor, a first terminal of the fourth MOS transistor and a second terminal of the eighth MOS transistor, via a sixth node N6, and a gate receiving the first bias signal V-bias.

In this embodiment, when external clock signal CFM and an inverted external clock signal CFMb with a distorted duty cycle are provided to the first differential amplifying circuit 210 of amplifier 201, and thus the RC time constant of the DLL increases to result in a lock failure, the lock failure signal S_fail at logic high may be applied to amplifier 201. When a logic high period of the internal clock signal CLKi is shorter than its logic low period, the inverted duty control signal S_dccb at logic high may be applied to the first differential amplifying 210 of amplifier 201, and a first current i1 may increase. When the first current i1 increases, a second current i2 may decrease because the current flowing through a first bias transistor Mb1 may be fixed.

Accordingly, the voltage of the first node N1 may decrease while the voltage of the second node N2 increases. Thus, the logic high period of the internal clock signal CLKi may also increase, thereby correcting the duty cycle to 50%:50%. In this embodiment, the duty cycle distortion can be generated because a logic high period of the clock signal is shorter than its logic low period. Alternatively, if a logic low period of the internal clock signal CLKi is shorter that its logic high period, an operation substantially opposite of the above-described operation may be performed in order to correct the duty cycle of the internal clock signal CLKi.

In the present embodiment, the duty cycle may be corrected in such a manner that the logic high period of the clock signal is increased. For example, when lock failure signal S_fail at logic high is applied to the gate of the sixth MOS transistor M6 221 of the second differential amplifying circuit 230, the fifth MOS transistor M5 may also be activated by the inverted control signal S_dccb, since the inverted control signal S_dccb may be responsive to the lock failure signal S_fail as discussed above. Thus, current flowing through the fifth and sixth MOS transistors M5 and M6 may increase. Since an amount of current that may flow through a second bias transistor Mb2 may be fixed, current flowing to the fourth, seventh, and eight MOS transistors M4, M7 and M8 may decrease as a result. Thus, a second current i2 may decrease. When the second current i2 decreases, voltage at a resistor R 233 may be reduced and the voltage at the second node N2 may increase. That is, the voltage of the internal clock signal CLKi may increase. Thus, the logic high period of the internal clock signal CLKi may increase. Furthermore, the amplifier 201 may perform an amplification operation in the saturation mode. The bias signal V_bias may make first and second bias transistors Mb1 and Mb2 operate in the saturation mode. Accordingly, as described above, the lock failure caused by a duty cycle distortion and a resultant increase in the RC time constant can be prevented and corrected by applying the lock fail signal S_fail to the gate of the sixth MOS transistor M6.

FIG. 3A illustrates a timing and waveform diagram for explaining the operation of the lock failure preventing apparatus according to an embodiment of the present invention, when a delay is relatively small. In this embodiment, the signal P0 may correspond with the internal clock signal CLKi obtained by passing the external clock signal CFM through the duty cycle correction circuit 110 illustrated in FIG. 1. The signal P180 may correspond to the delayed internal clock signal CLKi_D. More specifically, the signal P180 may be generated when the signal P0 is delayed by passing through the delay line 120 of FIG. 1. The input signal CLKi may be delayed such that rising edges of internal clock signal P0 correspond to falling edges of internal clock signal 180.

The full duty cycle of the signal P0 is from time a to time e. At time b, delayed from a start of the signal P0 at time a, the signal P180 (initial) has a rising edge. At time c, here at half the duty cycle, a rising edge of the signal P180 (after lock) may be locked to a falling edge of the signal P0. The signal P180 (initial) is delayed from its falling edge at time d to a falling edge of the signal P180 (after lock) at time e.

In this embodiment, when the duty cycle of the internal clock signal P0 is normal, i.e., where the duty cycle is 50%:50%, the initial value P180 (initial) of the delayed internal clock signal P180 may lead the internal clock signal P0 by an amount b-a. Accordingly, when the delayed internal clock signal P180 (initial) is delayed by an amount <x>, rising edges of the delayed internal clock signal P180 (after lock) may correspond to rising edges of the internal clock signal P0 at time e.

Referring to FIG. 1, the first CMOS converter 133 may receive signal P180 (after lock) and may convert it into a digital signal. The first CMOS converter 133 may set a reference level ref_high and may recognize the input signal as logic high when the signal P180 (after lock) is higher than the reference level ref_high. Accordingly, the first CMOS converter 133 may output a signal having a value 0 in a period between time a and time c, and a value 1 in a period between time c and time e of FIG. 3A.

Furthermore, the sampler 137 may sample the digital signal output from the first CMOS converter 133 and may output a digital signal 010101 . . . . When the decoder 141 receives this digital signal 010101 . . . , it may determine that the delaying operation is normally performed and a lock failure has not occurred. Accordingly, the decoder 141 may output the lock failure signal S_fail at logic low.

FIG. 3B is a timing and waveform diagram for explaining the operation of the lock failure preventing apparatus according to an embodiment of the present invention when the delay increases so as to be relatively longer due to a duty cycle distortion. In particular, the signal input to the delay line 120 of FIG. 1 may have a duty cycle that is not 50%:50% and a logic high period of the clock signal may be shorter than its logic low period.

The full duty cycle of the signal P0 is from time a' to time f'. At time b', when the signal P0 has completed half the distorted duty cycle, the signal P180 (initial) does not have a falling edge. Therefore, the delayed signal may not be locked within the duty cycle.

In this embodiment, the rising edges of the signal P0 may have a phase difference <x'> with respect to the falling edges of the signal P180 (initial). The duty cycle of the signal P0 and the signal P180 (initial) may be distorted. Thus, the phase difference <x'> may be greater than the phase difference <x> of FIG. 3A. In order to increase the delay of the delay cells 121-127 of FIG. 1, the RC time constant of the delay cells may be increased. For example, the RC time constant may be increased to 2RC in order to increase the delay of delay cells 121-127.

Referring to FIG. 1, in this embodiment, the first CMOS converter 133 may receive a signal P180 (2R*C) having a lock failure. The signal P180 (2R*C) may not be sufficiently charged up because the RC time constant increases. Thus, the signal P180 (2R*C) may not become logic high during a period between times c' and e' of FIG. 3B. The first CMOS converter 133 outputs a digital signal representing a logic high level only when a signal higher than the reference level ref_high is input thereto. However, the signal P180 (2R*C) is not charged up within a given time, so the signal P180 (2R*C) does not have exceed the reference level ref high during a period between times c' and e'. Therefore, a phase difference between the internal clock signal P0 and signals output from the delay line 120 is not 180°, but some other phase difference <y> or <z>. Accordingly, the first CMOS converter 133 continuously outputs a signal having a value 0.

The sampler 137 samples the digital signal output from the first CMOS converter 133 and outputs a digital signal 0000 . . . as the sampling result. The decoder 141 receives the digital signal 0000 . . . and determines that the delaying operation is not normally carried out and a lock failure has occurred. Accordingly, decoder 141 outputs the lock failure signal S_fail at a logic high level.

As described above, a lock failure preventing apparatus according to at least one embodiment of the present invention may detect a lock failure caused by a distortion of duty cycle and may correct the lock failure by correcting the duty cycle. A DLL according to at least one embodiment of the present invention may detect a lock failure caused by a distortion of duty cycle and may correct the duty cycle.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An apparatus for detecting a lock failure and correcting a duty cycle, the apparatus comprising:
   a lock failure detector to determine whether a first internal clock signal is locked to a second internal clock signal and to output a lock failure signal in response thereto;
   a duty cycle correction unit to correct a duty cycle of an external clock signal in response to the lock failure signal and to output the duty-cycle-corrected external clock signal as the first internal clock signal; and a delay unit to generate the second internal clock signal by delaying the first internal clock signal.

2. The apparatus as claimed in claim 1, wherein the lock failure detector comprises:
a coding unit to convert one of the first internal clock signal or the second internal clock signal into a code signal; and
a decoder to produce the lock failure signal by decoding the code signal, the lock failure signal having a logic level in accordance with a result of the decoding.

3. The apparatus as claimed in claim 2, wherein the coding unit comprises:
a first CMOS converter to convert one of the first internal clock signal or the second internal clock signal into a CMOS level signal and to output the CMOS level signal as a digital signal; and
a sampler to produce the code signal by sampling the digital signal.

4. The apparatus as claimed in claim 3, wherein the coding unit further comprises:
a second CMOS converter to receive the other one of the first internal clock signal or the second internal clock signal, to convert the received signal into a CMOS level signal, and to output the CMOS level signal as the digital signal.

5. The apparatus as claimed in claim 1, wherein the duty cycle correction unit comprises:
a charge pump to receive the first internal clock signal and to generate a duty control signal responsive to the first internal clock signal; and
an amplifier to correct the duty cycle of the external clock signal and to output the duty-cycle-corrected external clock signal as the first internal clock signal responsive to the duty control signal and the lock failure signal.

6. The apparatus as claimed in claim 5, wherein the amplifier comprises:
a first differential amplifying circuit to differentially amplify the internal clock signal and an inverted internal clock signal; and
a second differential amplifying circuit, connected in parallel with the first differential amplifying circuit, to differentially amplify the duty control signal and an inverted duty control signal in response to the lock failure signal.

7. The apparatus as claimed in claim 6, wherein the first differential amplifying circuit includes:
a first MOS transistor having a first terminal connected to a source of a high voltage through a first resistor and a gate receiving the external clock signal;
a second MOS transistor having a first terminal connected to the source of the high voltage through a second resistor and a gate receiving the inverted external clock signal; and
a first bias transistor having a first terminal connected to a second terminal of the first MOS transistor and a second terminal of the second MOS transistor, a second terminal connected to a source of a low voltage, and a gate receiving a bias signal.

8. The apparatus as claimed in claim 7, wherein the second differential amplifying circuit includes:
a third MOS transistor having a first terminal connected to the first terminal of the first MOS transistor and a gate receiving the inverted duty control signal;
a fourth MOS transistor having a first terminal connected to the first terminal of the second MOS transistor and a gate receiving the duty control signal;
a fifth MOS transistor having a first terminal connected to the first terminal of the first MOS transistor and a gate receiving the inverted duty control signal;
a sixth MOS transistor having a first terminal connected to a second terminal of the fifth MOS transistor and a gate receiving the lock failure signal;
a seventh MOS transistor having a first terminal connected to the first terminal of the second MOS transistor and a gate receiving the duty control signal;
an eighth MOS transistor having a first terminal connected to a second terminal of the seventh MOS transistor and a gate connected to the source of the low voltage; and
a second bias transistor having a first terminal connected to a second terminal of the sixth MOS transistor, a second terminal of the third MOS transistor, a first terminal of the fourth MOS transistor and a second terminal of the eighth MOS transistor, and a gate receiving the bias signal,
wherein the first through eighth MOS transistors operate in a saturation mode in response to the bias signal.

9. The apparatus as claimed in claim 8, wherein, when the lock failure signal is enabled to logic high level and applied to the gate of the sixth MOS transistor, the duty cycle is corrected to increase a logic high period of the internal clock signal.

10. A delay locked loop, comprising:
a lock failure detector to determine whether a first internal clock signal is locked to a second internal clock signal and to output a lock failure signal in response thereto;
a duty cycle correction unit to correct a duty cycle of an external clock signal in response to the lock failure signal and to output the duty-cycle-corrected external clock signal as the first internal clock signal;
a phase detector to detect a phase difference between the first and second internal clock signals and to output a phase difference signal;
a first charge pump to determine a control signal for the delay line based at least in part on the phase difference signal and to output the control signal; and
a delay line, including n delay cells connected in series, to generate the second internal clock signal by delaying the first internal clock signal according to the control signal.

11. The delay locked loop as claimed in claim 10, wherein the lock failure detector includes:
a coding unit to convert the first internal clock signal into a code signal; and
a decoder to produce the lock failure signal by decoding the code signal, the lock failure signal having a logic level that is based at least in part on a result of the decoding.

12. The delay locked loop as claimed in claim 11, wherein the coding unit comprises:
a CMOS converter to convert one of the first and second internal clock signals into a CMOS level signal and to output the CMOS level signal as a digital signal; and
a sampler to produce the code signal by sampling the digital signal.

13. The delay locked loop as claimed in claim 12, wherein the coding unit further comprises:
a second CMOS converter to receive the other one of the first and second internal clock signals, to detect a lock point of the received signal, to convert the received signal into a CMOS level signal, and to output the CMOS level signal as the digital signal.

14. The delay locked loop as claimed in claim 10, wherein the duty cycle correction unit comprises:

a second charge pump to receive the first internal clock signal and to generate a duty control signal responsive to the first internal clock signal; and an amplifier to correct the duty cycle of the external clock signal and to output the duty-cycle-corrected external clock signal as the first internal clock signal responsive to the duty control signal and the lock failure signal.

15. The delay locked loop as claimed in claim 14, wherein the amplifier comprises:

a first differential amplifying circuit to differentially amplify the internal clock signal and an inverted internal clock signal; and a second differential amplifying circuit, connected in parallel with the first differential amplifying circuit, to differentially amplify the duty control signal and an inverted duty control signal in response to the lock failure signal.

16. The delay locked loop as claimed in claim 15, wherein the first differential amplifying circuit includes:

a first MOS transistor having a first terminal connected to a source of a high voltage through a first resistor and a gate receiving the external clock signal;

a second MOS transistor having a first terminal connected to the source of the high voltage through a second resistor and a gate receiving the inverted external clock signal; and a first bias transistor having a first terminal connected to a second terminal of the first MOS transistor and a second terminal of the second MOS transistor, a second terminal connected to a source of a low voltage, and a gate receiving a bias signal.

17. The delay locked loop as claimed in claim 16, wherein the second differential amplifying circuit includes:

a third MOS transistor having a first terminal connected to the first terminal of the first MOS transistor and a gate receiving the inverted duty control signal;

a fourth MOS transistor having a first terminal connected to the first terminal of the second MOS transistor and a gate receiving the duty control signal;

a fifth MOS transistor having a first terminal connected to the first terminal of the first MOS transistor and a gate receiving the inverted duty control signal;

a sixth MOS transistor having a first terminal connected to a second terminal of the fifth MOS transistor and a gate receiving the lock failure signal;

a seventh MOS transistor having a first terminal connected to the first terminal of the second MOS transistor and a gate receiving the duty control signal;

an eighth MOS transistor having a first terminal connected to a second terminal of the seventh MOS transistor and a gate connected to the source of the low voltage; and a second bias transistor having a first terminal connected to a second terminal of the sixth MOS transistor, a second terminal of the third MOS transistor, a first terminal of the fourth MOS transistor and a second terminal of the eighth MOS transistor, and a gate receiving the bias signal, wherein the first through eighth MOS transistors operate in a saturation mode in response to the bias signal.

18. The delay locked loop as claimed in claim 17, wherein, when the lock failure signal is enabled to logic high level and applied to the gate of the sixth MOS transistor, the duty cycle is corrected to increase a logic high period of the non-inverted external clock signal.

19. The delay locked loop as claimed in claim 17, wherein, when the lock failure signal is enabled to logic high level and applied to the gate of the sixth MOS transistor, the duty cycle is corrected to increase a logic high period of the first internal clock signal.

20. The delay locked loop as claimed in claim 10, wherein the n delay cells are all turned on to delay the first internal clock signal and the n delay cells all have the same delay.

* * * * *